(12) United States Patent
Shaw et al.

(10) Patent No.: US 11,658,043 B2
(45) Date of Patent: May 23, 2023

(54) SELECTIVE ANISOTROPIC METAL ETCH

(71) Applicant: Applied Materials, Inc., Santa Clara, CA (US)

(72) Inventors: Jonathan Shaw, Oakland, CA (US); Priyadarshi Panda, Jersey City, NJ (US); Nancy Fung, Livermore, CA (US); Yongchang Dong, Sunnyvale, CA (US); Somaye Rasouli, San Jose, CA (US); Gene Lee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/389,119

(22) Filed: Jul. 29, 2021

(65) Prior Publication Data

US 2022/0068661 A1 Mar. 3, 2022

Related U.S. Application Data

(60) Provisional application No. 63/074,176, filed on Sep. 3, 2020.

(51) Int. Cl.
*H01L 21/3213* (2006.01)
(52) U.S. Cl.
CPC .............................. *H01L 21/32136* (2013.01)
(58) Field of Classification Search
None
See application file for complete search history.

(56) References Cited

U.S. PATENT DOCUMENTS

| 8,962,224 B2 | 2/2015 | Wu et al. |
| 9,576,811 B2 | 2/2017 | Kanarik et al. |

(Continued)

FOREIGN PATENT DOCUMENTS

| KR | 20010097410 A | 11/2001 |
| WO | 2019178030 A1 | 9/2019 |
| WO | 2019190781 A1 | 10/2019 |

OTHER PUBLICATIONS

International Search Report and Written Opinion dated Nov. 18, 2021 for Application No. PCT/US2021/043758.

(Continued)

*Primary Examiner* — Stephanie P Duclair
(74) *Attorney, Agent, or Firm* — Patterson + Sheridan, LLP

(57) ABSTRACT

A method of patterning a substrate is provided. The method includes modifying a surface of a metal-containing layer formed over a substrate positioned in a processing region of a processing chamber by exposing the surface of the metal-containing layer to plasma effluents of a chlorine-containing gas precursor and an oxygen-containing gas precursor to form a modified surface of the metal-containing layer. The method further includes directing plasma effluents of an inert gas precursor towards the modified surface of the metal-containing layer. The plasma effluents of the inert gas precursor are directed by applying a bias voltage to a substrate support holding the substrate. The method further includes anisotropically etching the modified surface of the metal-containing layer with the plasma effluents of the inert gas precursor to form a first recess having a first sidewall in the metal-containing layer.

20 Claims, 10 Drawing Sheets

(56) References Cited

U.S. PATENT DOCUMENTS

| | | |
|---|---|---|
| 9,633,867 B2 | 4/2017 | Tan et al. |
| 9,805,941 B2 | 10/2017 | Kanarik et al. |
| 9,837,312 B1 | 12/2017 | Tan et al. |
| 9,972,504 B2 | 5/2018 | Lai et al. |
| 9,984,858 B2 | 5/2018 | Kanarik et al. |
| 10,056,264 B2 | 8/2018 | Yang et al. |
| 10,096,487 B2 | 10/2018 | Yang et al. |
| 10,186,426 B2 | 1/2019 | Kanarik et al. |
| 10,304,659 B2 | 5/2019 | Kanarik et al. |
| 10,354,888 B2 | 7/2019 | Tan et al. |
| 10,515,816 B2 | 12/2019 | Kanarik et al. |
| 10,515,955 B1 | 12/2019 | Lin et al. |
| 10,727,073 B2 | 7/2020 | Tan et al. |
| 10,763,083 B2 | 9/2020 | Yang et al. |
| 11,069,535 B2 | 7/2021 | Lai et al. |
| 2016/0196985 A1 | 7/2016 | Tan et al. |
| 2016/0203995 A1 | 7/2016 | Kanarik et al. |
| 2016/0358782 A1 | 12/2016 | Yang et al. |
| 2017/0040214 A1 | 2/2017 | Lai et al. |
| 2017/0053810 A1 | 2/2017 | Yang et al. |
| 2017/0069462 A1 | 3/2017 | Kanarik et al. |
| 2017/0117159 A1 | 4/2017 | Kanarik et al. |
| 2017/0194166 A1* | 7/2017 | Tan .................. H01L 21/32138 |
| 2017/0229314 A1 | 8/2017 | Tan et al. |
| 2018/0033635 A1 | 2/2018 | Kanarik et al. |
| 2018/0233325 A1 | 8/2018 | Kanarik et al. |
| 2018/0240682 A1 | 8/2018 | Lai et al. |
| 2019/0108982 A1* | 4/2019 | Yang ................ H01L 29/66795 |
| 2019/0139778 A1 | 5/2019 | Kanarik et al. |
| 2019/0371795 A1 | 12/2019 | Lin et al. |
| 2020/0075586 A1 | 3/2020 | Lin et al. |
| 2020/0075588 A1 | 3/2020 | Lin et al. |
| 2020/0161139 A1 | 5/2020 | Kanarik et al. |
| 2020/0286743 A1 | 9/2020 | Lai et al. |
| 2020/0402770 A1 | 12/2020 | Yang et al. |
| 2021/0005425 A1* | 1/2021 | Yang ................ H01J 37/32926 |
| 2021/0005472 A1 | 1/2021 | Kanarik et al. |

OTHER PUBLICATIONS

Kanarik, et al., Atomic Layer Etching: Rethinking the Art of Etch, J. Phys. Chem. Lett. 2018, 9, 4814-4821.

* cited by examiner

SELECTIVE ANISOTROPIC METAL ETCH

CROSS-REFERENCE TO RELATED APPLICATIONS

This application claims benefit of U.S. provisional patent application Ser. No. 63/074,176, filed Sep. 3, 2020, which is incorporated herein by reference in its entirety.

BACKGROUND

Field

Implementations of the present disclosure generally relate to semiconductor devices and semiconductor device manufacturing. More particularly, implementations of the present disclosure relate to methods of selective anisotropic etching of conductive materials used in semiconductor devices.

Description of the Related Art

Fabrication of semiconductor devices includes forming (e.g., patterning) one or more materials having a desired size and spacing. For example, conductive materials can be patterned into conductive lines, such as access lines (e.g., word lines), digit lines (e.g., sense lines, bit lines), conductive contacts, and conductive traces. Other features can be patterned to form, for example, select devices of memory cells, memory storage elements, and other components of semiconductor devices.

As the feature size of semiconductor devices continues to shrink, it is more and more difficult to form patterns of features having a desired critical dimension. In addition, as the complexity of semiconductor devices increases, stack structures including materials to be patterned can exhibit a greater thickness (e.g., height). Further, as the number of patterning acts increases due to the increased complexity of semiconductor devices, a dimension (e.g., a height) or an aspect ratio (defined as a ratio between a height and a width of a structure) of mask materials, such as photoresist materials and hard mask materials, can increase to facilitate patterning of a desired number of features of the semiconductor device. However, as the height and/or aspect ratio of the mask material increases, materials formed through the mask can exhibit an undesired increase in sidewall roughness, a line width roughness (LWR), or a combination thereof. In addition, current etch processes for conductive materials often laterally etch the conductive material, which worsens sidewall roughness and LWR. Furthermore, when the conductive material (metal) used is a grain growth metal, which grows grains within the temperatures and thermal budgets of the device, such as ruthenium, there is an additional propensity for lateral etching along weak grain boundary of the metal leading to sidewall roughness and LWR.

Accordingly, there is a need for improved methods of etching conductive materials.

SUMMARY

Implementations of the present disclosure generally relate to semiconductor devices and semiconductor device manufacturing. More particularly, implementations of the present disclosure relate to methods of selective anisotropic etching of conductive materials used in semiconductor devices.

In one aspect, a method of patterning a substrate is provided. The method includes modifying a surface of a metal-containing layer formed over a substrate positioned in a processing region of a processing chamber by exposing the surface of the metal-containing layer to a chlorine-containing gas precursor and an oxygen-containing gas precursor to form a modified surface of the metal-containing layer. The method further includes directing plasma effluents of an inert gas precursor towards the modified surface of the metal-containing layer, wherein the plasma effluents of the inert gas precursor are directed by applying a bias voltage to a substrate support holding the substrate. The method further includes anisotropically etching the modified surface of the metal-containing layer with the plasma effluents of the inert gas precursor to form a first recess having a first sidewall in the metal-containing layer, wherein the plasma effluents of the inert gas precursor selectively etch the modified surface of the metal-containing layer relative to unmodified portions.

Implementation include one or more of the following. The inert gas precursor is argon. The metal-containing layer includes one or more of a group consisting of ruthenium (Ru), iridium (Ir), platinum (Pt), and rhodium. Anisotropically etching the modified surface of the metal-containing layer forms a feature comprising a bit-line metal-containing layer. The chlorine-containing gas precursor flows into the processing region at a flow rate of from about 10 sccm to about 50 sccm and the oxygen-containing gas precursor flows into the processing region at a flow rate of from about 100 sccm to about 150 sccm. A pressure within the processing region while modifying the surface of the metal-containing layer and anisotropically etching the modified surface of the metal-containing layer is maintained at or below about 20 mTorr. The bias voltage directing the plasma effluents of the inert gas precursor towards the modified surface of the metal-containing layer is at or below about 150 Watts. The method is repeated in at least one additional cycle. A temperature of the processing chamber electrostatic chuck (ESC) is maintained at or below about 50 degrees Celsius. Modifying the surface of the metal-containing layer is performed without etching the surface of the metal-containing layer. Inert gas ions are implanted into the surface of the metal-containing layer prior to modifying the surface of the metal-containing layer. The first recess is exposed to an etchant gas mixture including a passivation gas and an etchant gas to remove additional metal from the metal-containing layer. The method further includes forming a plasma of the etchant gas mixture, passivating, with plasma effluents of the passivation gas the first sidewall of the first recess, and anisotropically etching the first recess with plasma effluents of the etchant gas to deepen the first recess with a second sidewall in the metal-containing layer aligned with the first sidewall. The passivation gas is selected from nitrogen ($N_2$), sulfur dioxide ($SO_2$), or a combination thereof. The etchant gas comprises oxygen ($O_2$) and chlorine ($Cl_2$).

In another aspect, a method of patterning a substrate is provided. The method includes exposing a surface of a metal-containing layer formed over a substrate positioned in a processing region of a processing chamber to an etchant gas mixture including a passivation gas selected from $N_2$ and $SO_2$ and an etchant gas comprising $O_2$ and $Cl_2$. The method further includes anisotropically etching the metal-containing layer with a plasma of the etchant gas mixture.

Implementations can include one or more of the following. The method further includes modifying a surface of the metal-containing layer by exposing the surface of the metal-containing layer to plasma effluents of a chlorine-containing gas precursor and an oxygen-containing gas precursor to form a modified surface of the metal-containing layer prior to exposing the surface of the metal-containing layer to the etchant gas mixture. Anisotropically etching the metal-containing layer with a plasma of the etchant gas mixture removes the modified surface of the metal-containing layer.

In yet another aspect, a method of patterning a substrate is provided. The method includes exposing a surface of a ruthenium-containing layer formed over a substrate positioned in a processing region of a processing chamber to an etchant gas mixture. The etchant gas mixture includes 50-200 sccm of $O_2$; 10-100 sccm of $Cl_2$; 100-300 sccm of argon; and 5-100 sccm of $N_2$ or 10-30 sccm of $SO_2$. The method further includes anisotropically etching the ruthenium-containing layer with a plasma of the etchant gas mixture, including maintaining the substrate at a temperature from about 20 degrees Celsius to about 40 degrees Celsius and maintaining the plasma of the etchant gas mixture at a pressure from about 10 mTorr to about 20 MTorr.

Implementations can include one or more of the following. Anisotropically etching the ruthenium-containing layer forms a feature comprising a bit-line ruthenium-containing layer.

In yet another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above recited features of the present disclosure can be understood in detail, a more particular description of the implementations, briefly summarized above, can be had by reference to implementations, some of which are illustrated in the appended drawings. It is to be noted, however, that the appended drawings illustrate only typical implementations of this disclosure and are therefore not to be considered limiting of its scope, for the disclosure can admit to other equally effective implementations.

Figure 1:
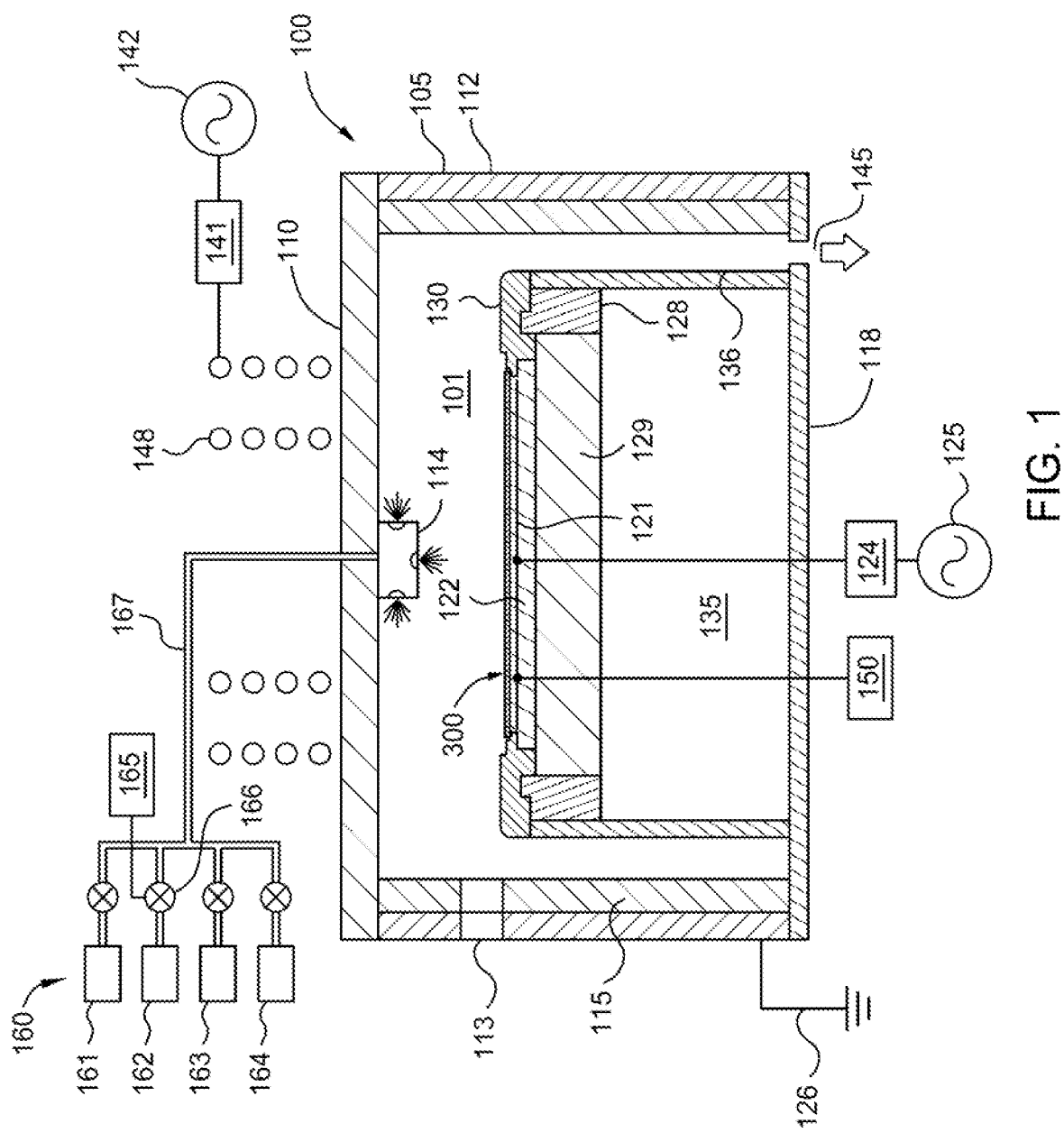
FIG. 1 illustrates a cross-sectional view of one example of a plasma processing chamber according to aspects of the disclosure.

To facilitate understanding, identical reference numerals have been used, where possible, to designate identical elements that are common to the figures. It is contemplated that elements and features of one implementation can be beneficially incorporated in other implementations without further recitation.

DETAILED DESCRIPTION

The following disclosure describes etching of conductive features. Certain details are set forth in the following description and in FIGS. 1-7E to provide a thorough understanding of various implementations of the disclosure. Other details describing well-known structures and systems often associated with etching are not set forth in the following disclosure to avoid unnecessarily obscuring the description of the various implementations. In addition, the apparatus description described herein is illustrative and should not be construed or interpreted as limiting the scope of the implementations described herein.

Many of the details, operations, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations of the present disclosure relate to methods of selective anisotropic etching of conductive materials used in semiconductor devices including, conductive features and methods for forming conductive features with reduced resistance and surface roughness, for example, bit line stacks and methods for forming bit line stacks with reduced resistance and bit line surface roughness. One or more implementations of the disclosure advantageously address the issue of resistivity reduction in spite of the need for shrinking nodes. In some implementations, the resistivity of the bit line is reduced by reducing the surface roughness of the bit line metal. Some implementations of the disclosure advantageously provide one or more of improved roughness, controlled anisotropic etch, improved selectivity to hardmask materials, and improved wafer-to-wafer and within wafer uniformity.

Current conventional etch processes typically etch metallic materials along grain boundaries, which can lead to rough sidewalls. Current atomic layer etch processes, which etch layer-by-layer, often lack directionality. This lack of directionality can lead to lateral etching of vertical sidewalls, which reduces critical dimensions and worsens sidewall roughness leading to defects along the structure such as the length of the bit line. Implementations described herein reduce the lateral etching present in currently known etching techniques and thus provide smooth sidewalls with reduced resistivity.

While the particular apparatus in which the implementations described herein can be practiced is not limited, it is particularly beneficial to practice the implementations in a SYM3® etch system sold by Applied Materials, Inc., Santa Clara, Calif. Additionally, other available etch systems can also benefit from implementations described herein.

A "substrate" as used herein, refers to a surface of a material, or a portion of a surface or a material upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, doped amorphous silicon, poly silicon, doped poly silicon, germanium, gallium arsenide, glass, sapphire, and any other materials such as metals, metal nitrides, metal alloys, and other conductive materials, depending on the application. Substrates include, without limitation, semiconductor wafers. In addition to film processing directly on the surface of the substrate itself, in the present disclosure, any of the film processing steps disclosed can also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate can be a silicon wafer, e.g., a 200-mm wafer, a 300-mm wafer, or a 450-mm wafer, including wafers having one or more layers of material such as dielectric, conducting, or semi-conducting material deposited thereon. A patterned substrate can have "features" such as vias or contact holes, which can be characterized by one or more of narrow and/or re-entrant openings, constrictions within the features, and high aspect ratios. The features can be formed in one or more of the above-described layers. One example of a feature is a hole or via in a semiconductor substrate or a layer on the substrate. Another example is a trench in a substrate or layer. In some implementations, the feature can have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some implementations, types of substrates fabricated from performing disclosed implementations can depend on the aspect ratios of features on the substrate prior to performing disclosed embodiments. Aspect ratios are a comparison of depth of a feature to the critical dimension of the feature (e.g., width/diameter). In some implementations, features on a substrate can have an aspect ratio of at least about 2:1, at least about 3:1, at least about 4:1, at least about 6:1, at least about 10:1, or higher. The feature can also have a dimension near the opening, e.g., an opening diameter or line width of between about 5 nm to 500 nm, for example between about 25 nm and about 300 nm. In one example for a DRAM application, the feature has a line width of from about 10 nm to about 40 nm with a line spacing from about 10 nm to about 30 nm (e.g., 24 nm line width with 20 nm space; 35 nm line width with 30 nm space; or 12 nm line width with 6 nm space.)

One or more implementations of the disclosure generally provide structures, which include one or more low-resistivity features formed from a thin film refractory metal (e.g., ruthenium) as, can be implemented in bit line structures and/or gate stacks. Some implementations include methods for forming bit line stacks. By way of example, a bit line structure formed in accordance with implementations of the present disclosure can be a memory type semiconductor device, such as a DRAM type integrated circuit.

FIG. 1 is a simplified cutaway view for of one example of a plasma processing chamber 100 suitable for patterning a material layer as well as forming a material layer disposed on a substrate 300 in the plasma processing chamber 100. The plasma processing chamber 100 is suitable for performing an etching process as described herein. One example of the plasma processing chamber 100 that can be adapted to benefit from the disclosure is a CENTRIS® SYM3® processing chamber, available from Applied Materials, Inc., located in Santa Clara, Calif. It is contemplated that other process chambers, including those from other manufactures, can be adapted to practice embodiments of the disclosure.

The plasma processing chamber 100 includes a chamber body 105 having a processing volume 101 defined therein. The chamber body 105 has sidewalls 112 and a bottom 118, which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and can be proportionally larger than the size of the substrate 300 to be processed therein. Examples of workpiece sizes include 200 mm diameter, 250 mm diameter, 300 mm diameter and 450 mm diameter, among others.

The chamber body 105 supports a chamber lid assembly 110 to enclose the processing volume 101. The chamber body 105 can be fabricated from aluminum or other suitable materials. A substrate access port 113 is formed through the sidewall 112 of the chamber body 105, facilitating the transfer of the substrate 300 into and out of the plasma processing chamber 100. The substrate access port 113 can be coupled to a transfer chamber and/or other chambers of a substrate processing system (not shown).

A pumping port 145 is defined in the chamber body 105 and connected to the processing volume 101. A pumping device (not shown) is coupled through the pumping port 145 to the processing volume 101 to evacuate and control the pressure of the processing volume 101. The pumping device can include one or more pumps and throttle valves.

A gas panel 160 is coupled by a gas line 167 to the chamber body 105 to supply process gases into the processing volume 101. The gas panel 160 can include one or more process gas sources 161, 162, 163, 164 and can additionally include inert gases, non-reactive gases, and reactive gases, if desired. Examples of process gases that can be provided by the gas panel 160 include, but are not limited to, oxygen-containing gases including $O_2$, $H_2O$, $H_2O_2$, $O_3$, $N_2O$, $NO_2$; halogen-containing gases including $Cl_2$, HCl, HF, $F_2$, $Br_2$, HCl, HBr, $SF_6$, $NF_3$; passivation gases including nitrogen ($N_2$) and sulfur dioxide ($SO_2$); and inert gases including argon, helium. Additionally, process gasses can include nitrogen, chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_2O$ and $H_2$ among others.

Valves 166 control the flow of the process gases from the sources 161, 162, 163, 164 from the gas panel 160 and are managed by a system controller 165. The flow of the gases supplied to the chamber body 105 from the gas panel 160 can include combinations of the gases.

The chamber lid assembly 110 can include a nozzle 114. The nozzle 114 has one or more ports for introducing the process gases from the sources 161, 162, 164, 163 of the gas panel 160 into the processing volume 101. After the process gases are introduced into the plasma processing chamber 100, the gases are energized to form plasma. An antenna 148, such as one or more inductor coils, can be provided adjacent to the plasma processing chamber 100. An antenna power supply 142 can power the antenna 148 through a match circuit 141 to inductively couple energy, such as RF energy, to the process gas to maintain a plasma formed from the process gas in the processing volume 101 of the plasma processing chamber 100. Alternatively, or in addition to the antenna power supply 142, process electrodes below the substrate 300 and/or above the substrate 300 can be used to capacitively couple RF power to the process gases to maintain the plasma within the processing volume 101. The operation of the antenna power supply 142 can be controlled by a controller, such as the system controller 165, that also controls the operation of other components in the plasma processing chamber 100.

A substrate support pedestal 135 is disposed in the processing volume 101 to support the substrate 300 during processing. The substrate support pedestal 135 can include an electrostatic chuck (ESC) 122 for holding the substrate 300 during processing. The ESC 122 uses the electrostatic attraction to hold the substrate 300 to the substrate support pedestal 135. The ESC 122 is powered by an RF power supply 125 integrated with a match circuit 124. The ESC 122 includes an electrode 121 embedded within a dielectric body. The electrode 121 is coupled to the RF power supply 125 and provides a bias, which attracts plasma ions, formed by the process gases in the processing volume 101, to the ESC 122 and substrate 300 positioned thereon. The RF power supply 125 can cycle on and off, or pulse, during processing of the substrate 300. The ESC 122 has an isolator 128 for the purpose of making the sidewall of the ESC 122 less attractive to the plasma to prolong the maintenance life cycle of the ESC 122. Additionally, the substrate support pedestal 135 can have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2000 volts to the electrode 121. The power source 150 can also include a system controller for controlling the operation of the electrode 121 by directing a DC current to the electrode 121 for chucking and de-chucking the substrate 300.

The ESC 122 can include heaters disposed therein and connected to a power source (not shown), for heating the substrate, while a cooling base 129 supporting the ESC 122 can include conduits for circulating a heat transfer fluid to maintain a temperature of the ESC 122 and substrate 300 disposed thereon. The ESC 122 is configured to perform in the temperature range desired by the thermal budget of the device being fabricated on the substrate 300. For example, the ESC 122 can be configured to maintain the substrate 300 at a temperature of about 25 degrees Celsius to about 150 degrees Celsius.

The cooling base 129 is provided to assist in controlling the temperature of the substrate 300. To mitigate process drift and time, the temperature of the substrate 300 can be maintained substantially constant by the cooling base 129 throughout the time the substrate 300 is in the plasma processing chamber 100. In one implementation, the temperature of the substrate 300 is maintained throughout the etching process at about 25 degrees Celsius to about 150 degrees Celsius.

A cover ring 130 is disposed on the ESC 122 and along the periphery of the substrate support pedestal 135. The cover ring 130 is configured to confine etching gases to a desired portion of the exposed top surface of the substrate 300, while shielding the top surface of the substrate support pedestal 135 from the plasma environment inside the plasma processing chamber 100. Lift pins (not shown) are selectively moved through the substrate support pedestal 135 to lift the substrate 300 above the substrate support pedestal 135 to facilitate access to the substrate 300 by a transfer robot (not shown) or other suitable transfer mechanism.

The system controller 165 can be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines can also be stored and/or executed by a second controller (not shown) that is collocated with the plasma processing chamber 100.

Figure 2:
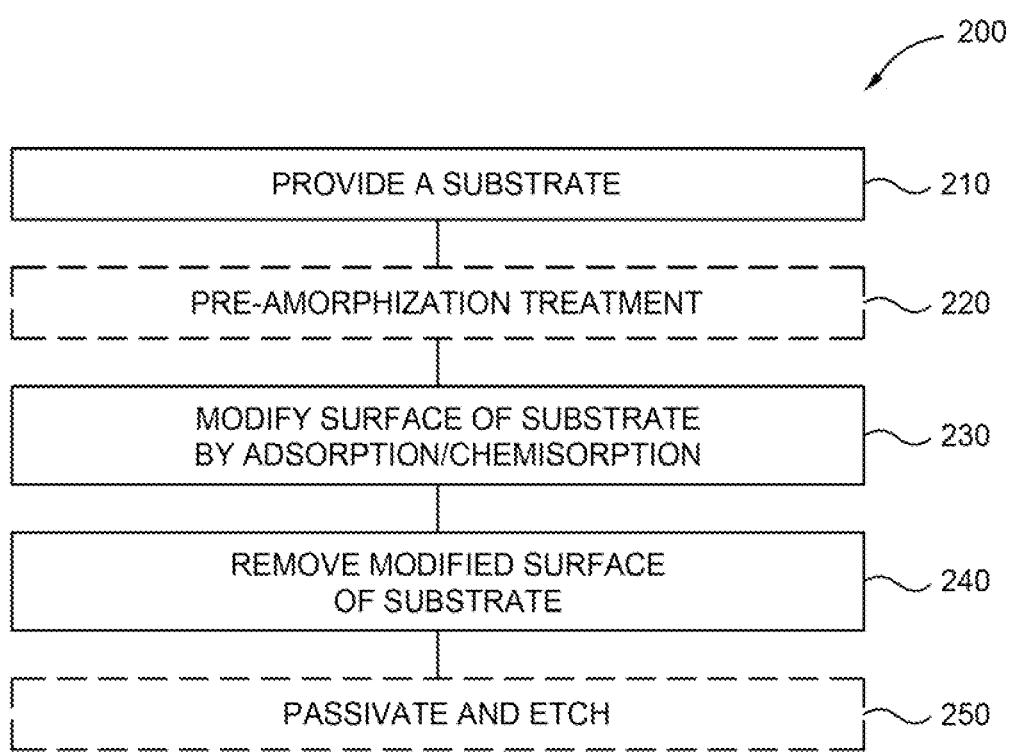
FIG. 2 illustrates a flowchart of a method of etching a feature in a substrate according to aspects disclosed herein.

FIG. 2 illustrates a flowchart of a method 200 of etching a feature in a substrate according to aspect disclosed herein. FIGS. 3A-3G illustrate various stages of an etching process according to aspects discloses herein. Although method 200 and FIGS. 3A-3G are discussed in the context of etching a high aspect ratio feature in a metal-containing layer it should be understood that method 200 can be used to etch other features in other types of substrates. In general, the method 200 is applicable to HAR contact mask open processes of DRAM, flash memory and logic devices as well as HAR line/space patterns (e.g., for gate line, bit line, interconnect line etches). For example, in DRAM applications, line/space etches for forming bit lines.

The method 200 begins at operation 210 by providing a substrate. The substrate can be substrate 300 depicted in FIG. 1. The substrate 300 includes a film stack 302 disposed thereon. In the implementation shown in FIG. 3A, the film stack 302 includes a metal-containing layer 310 having a hardmask layer 312 disposed thereon. The film stack 302 without the hardmask layer 312 (i.e., just the metal-containing layer 310) can also be processed according to the method 200. In addition, the film stack 302 can include additional layers. For example, for some DRAM applications, the film stack 302 can further include cap materials, barrier materials, and/or photoresist materials. In some implementations, the metal-containing layer 310 comprises, consists essentially of, or consists of a grain growth metal layer such as ruthenium, which grows grains at normal thermal budgets for memory manufacturing (e.g., 900 degrees Celsius at five minutes). In some implementations, the metal-containing layer 310 comprises one or more of ruthenium (Ru), iridium (Ir), platinum (Pt), or rhodium (Rh). In one example, the metal-containing layer 310 comprises, consists essentially of, or consists of ruthenium. As used herein, the term "consists essentially of ruthenium" means that the ruthenium or component of the metal-containing layer 310 is greater than or equal to about 95%, 98%, or 99% of the metal-containing layer 310. In one example, the metal-containing layer 310 is a bit line metal layer. The bit line metal layer can comprise, consist essentially of, or consist of ruthenium. In some implementations, the hardmask layer 312 comprises one or more of silicon oxide, silicon nitride, silicon oxynitride, silicon carbide, or silicon carbonitride. In one example, the hardmask layer 312 comprises or consists of silicon nitride. In one example, the metal-containing layer 310 is a ruthenium layer and the hardmask layer 312 is a silicon nitride hardmask layer.

Figure 3A:
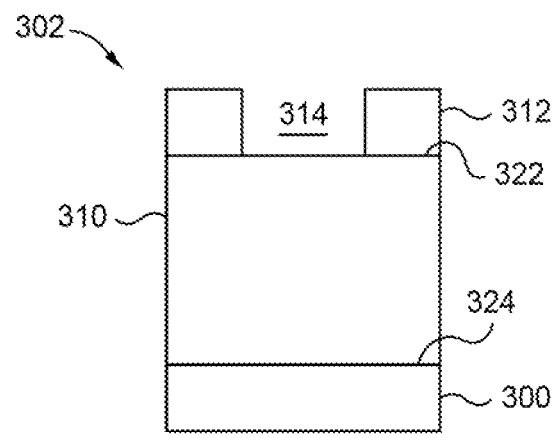
FIGS. 3A-3G illustrate various stages of an etching process according to aspects disclosed herein.

In the implementation shown in FIG. 3A, the metal-containing layer 310 is a blanket layer and the hardmask layer 312 is a patterned hardmask having an opening or aperture 314 formed therethrough. Following deposition of the hardmask layer 312, commonly known photolithography and etch processes can be employed to pattern the hardmask layer 312 and form the aperture 314 extending through the hardmask layer 312. The substrate 300 can then be provided to the processing region to proceed with method 200.

Figure 3B:
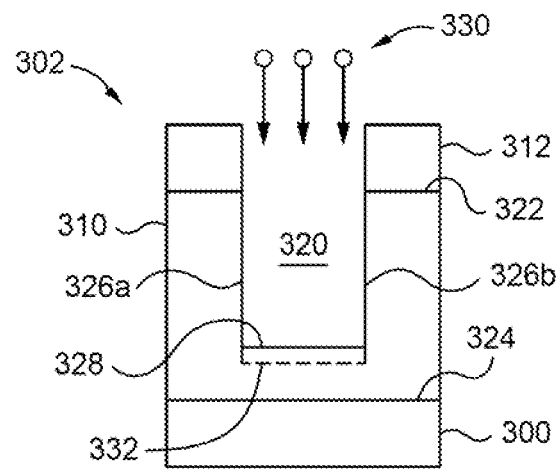

However, as shown in the implementation of FIG. 3B, the metal-containing layer 310 can have at least a first feature 320 formed or partially formed therein. The at least one first feature 320 can extend a feature depth from a top surface 322 of the metal-containing layer 310 toward a bottom surface 324 of the metal-containing layer 310. The at least one first feature 320 has a width defined by a first sidewall 326a and a second sidewall 326b. The at least one first feature 320 can extend a feature depth from the top surface 322 of the metal-containing layer 310 to a bottom surface 328 of the first feature 320.

At operation 220, an optional pre-amorphization treatment process is performed to modify exposed surfaces of the metal-containing layer 310. The pre-amorphization treatment can include exposing the substrate 300 to an ion doping/implantation process. In one implementation, a beamline implantation technique is employed to implant the dopant species. In another implementation, a conformal doping technique, such as a plasma doping (PLAD) technique, may be employed to implant the dopant species.

In implementations where the pre-amorphization treatment process of operation 220 is not performed, the modification process at operation 230, which will be described in greater detail below, can be performed directly on the metal-containing layer 310 without the pre-amorphization treatment.

In some implementations, the ion doping/implantation process of operation 220 is performed to dope, coat, treat, implant, insert or modify certain film/surface properties on certain locations including the bottom surface 328 of the first feature 320 of the metal-containing layer 310 with dopants formed into, forming a doped region 332 in the metal-containing layer 310. The ion doping/implantation process utilizes incident ions to modify film/surface properties on the metal-containing layer 310, with dopants doped thereto to form the doped region 332. The ions, which include a desired type of atoms (e.g., inert species), can be doped into the metal-containing layer 310 with desired concentration. The ions doped into the metal-containing layer 310 can modify the film/surface properties of the metal-containing layer 310, which can affect, improve or alter the lattice structure, degree of crystalline, bonding structure or film density of the metal-containing layer 310, forming the doped region 332. The ion doping/implantation process of operation 220 is typically performed to modify the surface of the metal-containing layer 310 without sputtering or substantially sputtering the metal-containing layer 310.

Suitable ion species for the ion doping/implantation process can be generated from inert precursor materials, such as helium, argon, neon, krypton, and xenon. In one implementation, the dopant or inert species is selected from helium, argon, neon, krypton, or a combination thereof.

In some implementations, the doping/implant process of the pre-amorphization treatment process includes a doping/implant process, which is performed to implant ions 330 into the metal-containing layer 310 to a depth to form the doped region 332, which extends below the bottom surface 328 of the first feature 320. The ions 330 penetrate the metal-containing layer 310 to various depths depending on the type and size of the ions and the power and bias utilized to energize the ions 330. The species of ions 330 may be tailored to provide increased etch selectivity of the doped region 332. Not to be bound by theory but it is believed that within the doped region 332, the ions implanted at operation 220 create damaged atomic bonds in the metallic lattice structure, rendering the material defined by the doped region 332 susceptible to separation along the doped region 332. In one example, the doped region 332 can be formed from about 10 Å to about 2,000 Å, such as about 100 Å below the bottom surface 328 of the first feature 320.

Several process parameters can be controlled during operation 220. The ion dosage and implant energy selection can depend on the type of dopant utilized, the type of material utilized as the metal-containing layer 310 and the desired modification of the metal-containing layer 310. The substrate temperature during operation 220 can be controlled at from about or at 5 degrees Celsius to about or at 80 degrees Celsius, such as from about or at 40 degrees Celsius to about or at 50 degrees Celsius. The overall chamber pressure during operation 220 can be from about or at 1 mTorr to about or at 50 mTorr, for example, from about or at about 10 mTorr to about or at 30 mTorr; or from about or at about 10 mTorr to about or at about 15 mTorr.

The optional pre-amorphization treatment of operation 220 can be performed in a chamber different from the other operations of method 200. For example, the substrate 300 is positioned in a chamber different from plasma processing chamber 100, such as an ion implantation chamber.

Figure 3C:
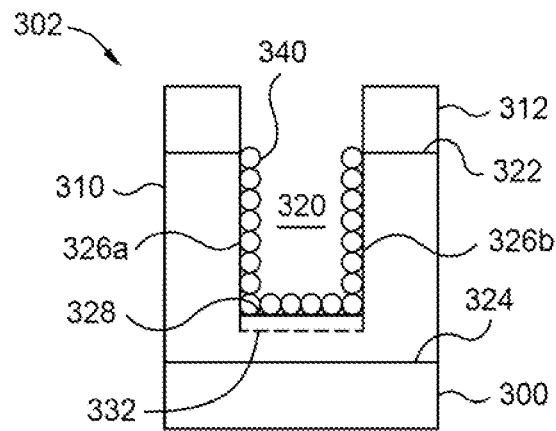

The method 200 continues at operation 230 where the substrate 300 is exposed to a modification process to modify a surface of the substrate by adsorption and/or chemisorption. The substrate 300 can be positioned on substrate support pedestal, such as the substrate support pedestal 135 in the plasma processing chamber 100 depicted in FIG. 1. The modification process can include contacting the metal-containing layer 310 with a halide and oxygen-containing chemistry. The halide and oxygen-containing chemistry can be in the form of a gas, a plasma, or a reactive species. The modification process can include contacting the metal-containing layer 310 with halide and oxygen-containing gases or gas mixtures, which adhere to a surface of the metal-containing layer by adsorption or chemisorption onto the metal-containing layer. The modification process can include contacting the metal-containing layer 310 with effluents of a halide and oxygen-containing plasma. An oxygen-containing gas, a halogen-containing gas, or a mixture thereof can be flowed into the processing region to form an in-situ plasma or into a remote plasma region to produce plasma effluents. The plasma effluents can be flowed into the processing region to interact with exposed surfaces of the first feature 320 of the substrate 300. For example, as shown in FIG. 3C, the plasma effluents form a thin reactive surface layer 340 on sidewalls 326a, 326b and the bottom surface 328. In the context of the present document, "reacting" or "reaction" refers to a change or transformation in which a substance decomposes, combines with other substances, or interchanges constituents with other substances. Thus, it will be appreciated that "chemisorbing" or "chemisorption" is a specific type of reacting or reaction that refers to taking up and chemically binding (a substance) onto the surface of another substance.

In some implementations, the modification process performed at operation 230 includes exposing the substrate 300 to a modification gas mixture in the presence of an energy source. The modification gas mixture includes an oxygen-containing gas, a halogen-containing gas, and optionally an inert gas. The oxygen-containing gas can be selected from $O_2$, $H_2O$, $H_2O_2$, $O_3$, $N_2O$, $NO_2$, or a combination thereof. In one example, the oxygen-containing gas is selected from $O_2$, $O_3$, or a combination thereof. Not to be bound by theory but it is believed that oxygen reacts with ruthenium to form etch by-products, which can easily pumped from the processing chamber. The halogen-containing gas can be selected from a halogen, $Cl_2$, HCl, HF, $F_2$, $Br_2$, HCl, HBr, $SF_6$, $NF_3$, or a combination thereof. In one example, the halogen-containing gas is $Cl_2$. The inert gas can include argon, helium, xenon, krypton, nitrogen, or a combination thereof. In one example, the oxygen-containing gas is $O_2$ and the halogen-containing gas is $Cl_2$. Operation 230 is conducted such that the modification of the surface material of the metal-containing layer 310 to be removed or etched is favored over other surface materials present on the substrate 300. Not to be bound by theory, but it is believed that operation 230 forms the thin reactive surface layer 340 with a thickness that is more easily removed than unmodified surfaces. For example, in one implementation where the metal layer is ruthenium, $Cl_2$ and $O_2$ plasma species form covalent bonds with the exposed ruthenium surfaces (e.g., Ru→$RuO_2$—$RuO_2Cl_x$→$RuO_4$+$Cl_2$).

In some implementations, a plasma based on the modification gas mixture can be generated during operation 230. The species generated from the modification gas mixture-based plasma can be generated in-situ by forming a plasma in the process chamber housing the substrate or can be generated remotely in a process chamber that does not house the substrate such as a remote plasma generator, and can be supplied into the process chamber housing the substrate. In some implementations, the plasma can be an inductively coupled plasma or a capacitively coupled plasma or a microwave plasma. Power for an inductively coupled plasma can be set at from about 50 W and about 2000 W, such as about 300 W. Power can be set at a low enough level so as not to cause direct plasma etching of the substrate.

In some implementations, a low RF bias power of less than about 500 Watts is applied to ions formed from the oxygen and the halogen-containing gas to bombard the substrate with low energy. The low RF bias power reduces spontaneous etching of the surface of the substrate by the modification gas mixture while allowing for chemisorption of the modification gas chemistry on exposed surfaces of the substrate. In one example, the bias RF power is maintained at from about 10 Watts to about 500 Watts, for example, from about 10 Watts to about 200 Watts, such as, from about 50 Watts to 100 Watts.

In one example, during operation 230, for a 300 mm substrate, the oxygen-containing gas can flow into the processing region at a rate of from about 10 sccm to about 200 sccm such as from about 100 sccm to about 150 sccm. The halogen-containing gas can flow into the processing region at a rate of from about 10 sccm to about 50 sccm such as from about 30 sccm to about 50 sccm. The source RF power can be maintained at from about 50 Watts to about 2,000 Watts such as from about 200 Watts to about 300 Watts at a RF voltage from about 0 Volts to about 500 Volts. The bias RF power can be maintained at from about 10 Watts to about 500 Watts such as from about 100 Watts to about 200 Watts at a RF voltage from about 0 Volts to about 500 Volts, such as from about 50 Volts and about 250 Volts, for example, less than 200 Volts. The substrate temperature during operation 230 can be controlled at from about or at 5 degrees Celsius to about or at 80 degrees Celsius, such as from about or at 40 degrees Celsius to about or at 50 degrees Celsius. The overall chamber pressure during operation 230 can be from about or at 1 mTorr to about or at 50 mTorr, for example, from about or at about 10 mTorr to about or at 30 mTorr; or from about or at 10 mTorr to about or at 20 mTorr.

In some implementations, a purge can be performed after the modification process of operation 230. In a purge operation, non-surface bound oxygen and chlorine species are removed from the process chamber. This can be done by purging and/or evacuating the process chamber to remove non-adsorbed modification chemistry, without removing the chemisorbed layer. The species generated in a chlorine and oxygen-based plasma can be removed by stopping the plasma and allowing the remaining species to decay, optionally combined with purging and/or evacuation of the chamber. Purging can be done using any inert gas such as $N_2$, Ar, Ne, He, or a combination thereof.

Figure 3D:
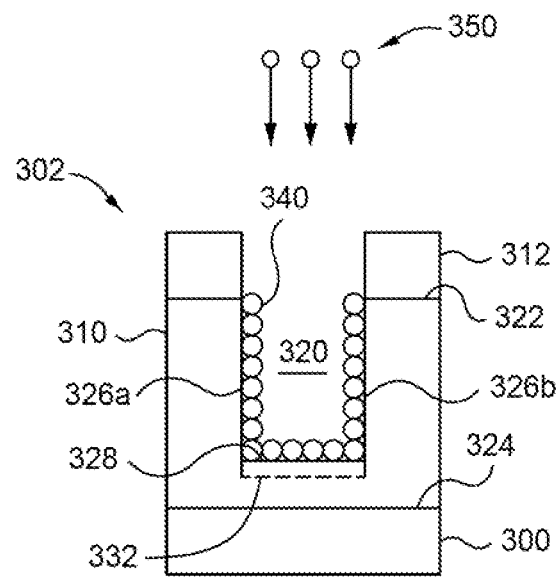

The method 200 continues at operation 240 where the substrate 300 is exposed to a removal gas such as a plasma or an ion bombardment gas to selectively etch or remove the modified portions of the surface of the substrate 300 as shown in FIG. 3D. The removal gas or ion bombardment gas can be an inert gas plasma. The inert gas is selected from argon, neon, krypton, helium, or a combination of. In one example, the inert gas is argon. In one example, the inert gas plasma is generated in-situ by forming a plasma in the processing region containing the substrate 300. In another example, the inert gas plasma is generated remotely and can be supplied into the process chamber housing the substrate. In some implementations, the plasma can be an inductively coupled plasma or a capacitively coupled plasma or a microwave plasma.

Figure 3E:
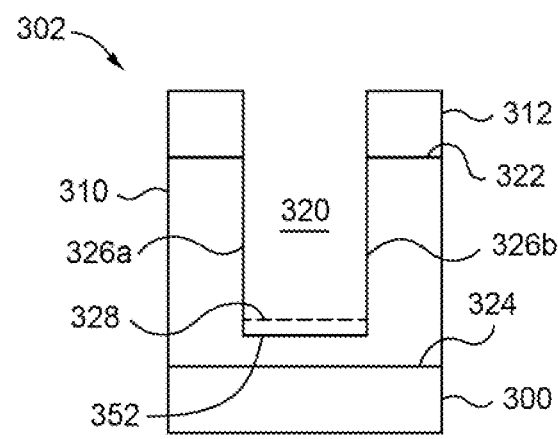

Operation 240 is conducted such that removal of modified portions from horizontal surfaces, such as the bottom surface 328 of the first feature 320 is favored over removal of modified portions from vertical surfaces such as the sidewalls 326a, 326b of the first feature 320. In some implementations during operation 240, the substrate 300 is bombarded with an ion flux 350 to etch the substrate 300. The ion flux 350 provides directional energy transfer to facilitate removal of the modified portions of the metal-containing layer 310. In one example, the ion flux is anisotropic such that exposure of the sidewalls 326a, 326b of the first feature 320 is reduced. The ion flux 350 bombards the horizontal surfaces such as the bottom surface 328 of the first feature 320 as shown in FIG. 3D to selectively remove modified portions from the bottom surface 328 of the first feature 320 relative to the sidewalls 326a, 326b extending the first feature 320 downward to a second bottom surface 352 as shown in FIG. 3E. In some implementations, where operation 220 is performed, the doped region 332 can also be selectively etched or removed during operation 240.

In one example, the ion flux 350 can be produced from any of the aforementioned inert gases using a low frequency RF source power. The ion flux 350 can be of one or more types of atomic or molecular inert species having a low ion energy. Example of suitable ionic species include helium ions, neon ions, xenon ions, argon ions, or combinations thereof having a low ionization potential such that very low plasma biases can be provided to reduce energy levels of the ion flux 350. In one example, the inert gas is argon and the plasma activation produces argon ions in the processing region, which bombard and directionally etch the modified portions of the substrate 300.

During operation 240, bias is also applied to the substrate 300 to direct ions toward the horizontal surfaces of the substrate 300. The bias can be generated using a power from about 50 Watts to about 1500 Watts, for example, from about 50 Watts to about 250 Watts; or from about 50 Watts to about 100 Watts.

In one example, during operation 240, for a 300 mm substrate, argon gas can flow into the plasma reactor at a rate of from about 10 sccm to about 400 sccm, for example, from about 100 sccm to 150 sccm. The source RF power can be maintained at from about 50 Watts to about 200 Watts, for example from about 100 Watts to about 150 Watts at a RF voltage from about 0 Volts to about 500 Volts. The bias RF power can be maintained at from about 50 Watts to about 300 Watts, for example, from about 100 Watts to about 150 Watts at a RF voltage from about 0 Volts to about 500 Volts, such as from about 50 Volts and about 250 Volts, for example, less than 200 Volts. The substrate temperature during operation 240 can be controlled at from about or at 5 degrees Celsius to about or at 80 degrees Celsius, such as from about or at 40 degrees Celsius to about or at 50 degrees Celsius. The overall chamber pressure during operation 240 can be from about or at 1 mTorr to about or at 50 mTorr, for example, from about or at about 10 mTorr to about or at 30 mTorr; or from about or at 10 mTorr to about or at 20 mTorr.

Not to be bound by theory but it is believed that bombarding the metal-containing layer 310 with the ion flux creates directional energy transfer using argon to facilitate "etch" or removal of the modified portions. The etching of operation 240 can be considered atomic layer etching or molecular level etching (MLE) since the portion removed is on the order of the dimension of the molecular constituents in the metal film.

In some implementations, a purge can be performed after the selective etch of operation 240. In a purge operation, plasma species are removed from the process chamber. This can be done by purging and/or evacuating the process chamber to remove remaining plasma species and etch byproducts. The plasma species generated can be removed by stopping the plasma and allowing the remaining species to decay, optionally combined with purging and/or evacuation of the chamber. Purging can be done using any inert gas such as $N_2$, Ar, Ne, He, or a combination thereof.

Figure 3F:
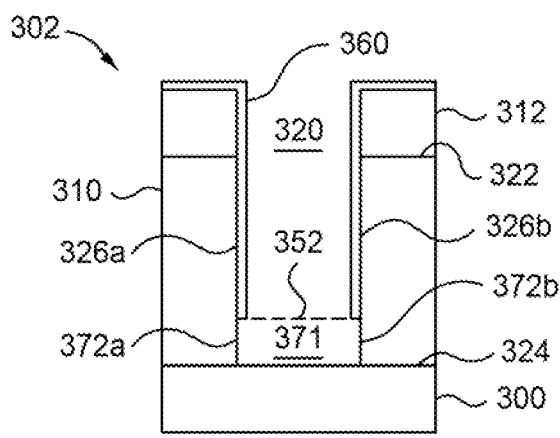
Figure 3G:
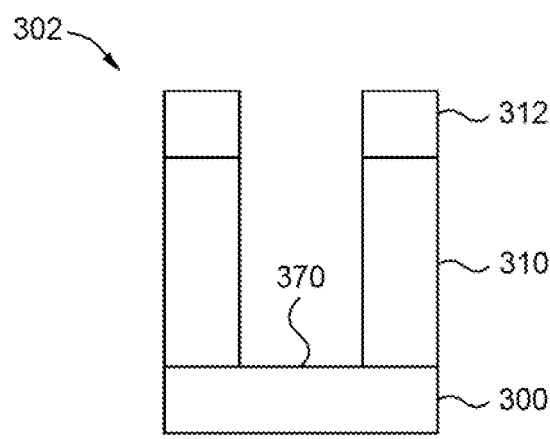

In some implementations, operations 220 to 240 can be repeatedly performed or cycled in a cycle of implant followed by modification and then etching of the metal layer to achieve a targeted etch depth of the metal layer. In some implementations, operations 230 and 240 can be repeatedly performed or cycled in a cycle of modification followed by etching of the metal layer to achieve a targeted etch depth of the metal-containing layer 310. In one example, at least one of operations 220, 230, and 240 are repeated until a top surface 370 of substrate 300 is exposed as shown in FIG. 3G.

At operation 250, an optional passivation and etch process is performed where the substrate 300 is exposed to an etchant gas mixture including a passivation gas and an etchant gas to selectively passivate and etch additional metal from the metal-containing layer 310. Operation 250 is conducted such that the sidewalls 326a, 326b are passivated while additional metal from the second bottom surface 352 of the first feature 320 is removed to form a second feature 371 having sidewalls 372a, 372b (collectively 372) while maintaining a smooth sidewall etch profile. As shown in FIG. 3F, the sidewalls 372a, 372b of the second feature are substantially aligned with the sidewalls 326a, 326b of the first feature 320. The passivation gas primarily serves a sidewall passivation function to reduce undercut and bowing of the etch profile of the metal-containing layer 310. The passivation gas is selected from nitrogen ($N_2$), sulfur dioxide ($SO_2$), or a combination thereof. The etchant gas includes oxygen ($O_2$) and chlorine ($Cl_2$). The etchant gas can further include an inert gas. The inert gas is selected from argon, neon, krypton, helium, or a combination of. In one implementation, the etchant gas mixture includes $O_2$, $Cl_2$, $N_2$, and Ar. In one example, the etchant gas mixture comprises, consists essentially of, or consists of 50-200 sccm of $O_2$, 10-100 sccm of $Cl_2$, 5-100 sccm of $N_2$, and 100-300 sccm of argon. As used herein, the term "consists essentially of" means that the listed components of the etchant gas mixture are greater than or equal to about 95%, 98%, or 99% of the total etchant gas mixture. In another implementation, the etchant gas mixture includes $O_2$, $Cl_2$, $SO_2$, and Ar. In one example, the etchant gas mixture comprises, consists essentially of, or consists of, 50-200 sccm of $O_2$, 10-100 sccm of $Cl_2$, 10-30 sccm of $SO_2$, and 100-300 sccm of argon.

A plasma is formed from the etchant gas mixture. In one example, the etchant plasma is generated in-situ by forming a plasma in the processing region containing the substrate 300. In another example, the etchant gas plasma is generated remotely and can be supplied into the process processing region containing the substrate 300. In some implementations, the plasma can be an inductively coupled plasma, a capacitively coupled plasma, or a microwave plasma.

Plasma effluents of the passivation gas convert exposed surfaces of the first sidewall 326a and the second sidewall 326b (collectively 326) into a passivation layer 360. Formation of the passivation layer 360 enables etching of the substrate without detriment of the sidewall profiles of the first sidewall 326a and the second sidewall 326b. The passivation layer 360 is distinguished from a deposited material in that passivation layer 360 is the result of a conversion of a portion of the metal-containing layer 310. Therefore, the passivation layer 360 is not merely deposited on the sidewalls 326a, 326b of the metal-containing layer 310, but rather a surface layer of the sidewalls 326a, 326b is consumed in a reaction to form the passivation layer 360. Because the passivation layer 360 is converted from a layer of metal-containing layer 310, in an implementation, the operation 250 converts the portion of metal-containing layer 310, along the sidewalls 326a, 326b of the first feature 320. Therefore, only a thin surface layer of the metal-containing layer 310 is to be converted into the passivation layer 360, limiting the thickness of the passivation layer and thereby avoiding formation of a step between the sidewalls 326a, 326b of the first feature 320 and sidewalls 372a, 372b (collectively 372) of the subsequently formed second feature 371 when the second feature 371 is subsequently etched. The sidewalls 372a, 372b of the second feature are substantially aligned with the sidewalls 326a, 326b of the first feature 320. In one example, from about 3 Å to about 15 Å of the surface layer of the metal-containing layer 310 on the first sidewall 326a and the second sidewall 326b is converted into the passivation layer 360. In another example, the passivation layer 360 is less than 50 Å. In yet another example, the passivation layer 360 has a thickness no greater than the thickness of a native oxide of the substrate. In yet another example, where the metal-containing layer 310 is ruthenium, the passivation layer 360 is from about 10 Å to about 20 Å.

The passivation layer 360 can be an oxide or nitride of the metal-containing layer 310. In one implementation, a passivating oxide can be formed by isotropically oxidizing the first feature 320 with an oxidizing plasma. A weakly oxidizing plasma forms a passivation layer that is the proper thickness. In one implementation, the weakly oxidizing plasma can include a low partial pressure of sulfur dioxide ($SO_2$) gas or a low partial pressure of oxygen ($O_2$) gas. In one example, the oxidizing plasma contains less than 100 sccm of $O_2$ or $SO_2$, for example, from about 10 sccm to about 30 sccm of $O_2$. In another implementation, a nitrogen source, such as nitrogen ($N_2$), is provided to the processing region to convert the surface of the metal-containing layer 310 of the substrate 300 on the first sidewall 326a and the second sidewall 326b into a nitride of the metal-containing layer 310. In one example, the nitriding plasma contains less than 100 sccm of $N_2$, for example, from about 10 sccm to about 30 sccm of $N_2$.

In some implementations, the process pressure during operation 250 is low to reduce undercut and bowing of the metal-containing layer 310. In some implementations, the process pressure is at or below 50 mTorr (e.g., from about 10 mTorr to about 50 mTorr). In some implementations, the process pressure is at or below 40 mTorr (e.g., from about 10 mTorr to about 40 mTorr). In some implementations, the process pressure is at or below 30 mTorr (e.g., from about 10 mTorr to about 30 mTorr). In some implementations, the process pressure is at or below 20 mTorr (e.g., from about 10 mTorr to about 20 mTorr). In one example, a plasma of an etchant gas mixture including 50-200 sccm of $O_2$, 10-100 sccm of $Cl_2$, 10-100 sccm of $N_2$, and 100-300 sccm of argon is maintained at a pressure at or below 20 mTorr. In another such example, a plasma of an etchant gas mixture including 50-200 sccm of $O_2$, 10-100 sccm of $Cl_2$, 10-100 sccm of $SO_2$, and 100-300 sccm of argon is maintained at a pressure at or below 20 mTorr.

In further implementations, the substrate is maintained at a temperature of from about 5 degrees Celsius to about 80 degrees Celsius, and more particularly from about 20 degrees Celsius to about 50 degrees Celsius during operation 250. These low process temperatures have been found to significantly improve the etch profile (e.g., reducing bowing) in the metal-containing layer 310. In some implementations, the substrate is maintained at a temperature from about 30 degrees Celsius and 40 degrees Celsius. In some implementations, the substrate is maintained at a temperature from about 40 degrees Celsius and 50 degrees Celsius. In one example, a plasma of an etchant gas mixture including 50-200 sccm of $O_2$, 10-100 sccm of $Cl_2$, 10-100 sccm of $N_2$, and 100-300 sccm of argon is maintained at a pressure at or below 20 mTorr while the substrate is from about 30 degrees Celsius to about 40 degrees Celsius during operation 250. In another example, a plasma of an etchant gas mixture including 50-200 sccm of $O_2$, 10-100 sccm of $Cl_2$, 10-100 sccm of $N_2$, and 100-300 sccm of argon is maintained at a pressure at or below 20 mTorr while the substrate is from about 30 degrees Celsius to about 40 degrees Celsius during operation 250.

In some implementations, at least one RF generator operating at 2 MHZ, 60 MHz, or 162 MHz energizes the etching gas mixture into a plasma during the etching of the metal-containing layer 310 during operation 250. The RF energy may be CW (continuous wave) or pulsed at 10-100 KHz pulse frequency. For implementations employing two or more RF energy sources (generators), one RF generator may be pulsed (single) or more of the RF generators may be pulsed (synchronized). In one implementation including both a 2 MHz and 60 MHz, bottom (bias) power source and 162 MHz top (source) power source, the 2 MHz generator may be operated to output 0-1,000 Watts in CW, single pulse mode, or synchronized pulse mode while the 60 MHz generator is operated to output 0-3,000 Watts in CW, single pulse, or synchronized pulse mode. In a further implementation, both the 2 MHz and the 60 MHz output more than 0 Watts of power. In further implementations, the 162 MHz source power is operated at 0-2500 Watts with CW, single pulse mode or synchronized pulse mode.

In some implementations, the source RF power can be maintained at from about 1000 Watts to about 3000 Watts, for example from at or about 1500 Watts to at or about 2000 Watts at a RF voltage from about 0 Volts to about 500 Volts. The bias RF power can be maintained at from about 50 Watts to about 300 Watts, for example, from about 100 Watts to about 150 Watts at a RF voltage from about 0 Volts to about 500 Volts, such as from about 50 Volts and about 250 Volts, for example, less than 200 Volts.

In some implementations, a purge can be performed after the etch of operation 250. In a purge operation, plasma species are removed from the process chamber. This can be done by purging and/or evacuating the process chamber to remove remaining plasma species and etch byproducts. The plasma species generated can be removed by stopping the plasma and allowing the remaining species to decay, optionally combined with purging and/or evacuation of the chamber. Purging can be done using any inert gas such as $N_2$, Ar, Ne, He, or a combination thereof.

In some implementations, operations 220 to 250 can be repeatedly performed or cycled in a cycle of implant followed by modification then selective etching of the metal layer followed by passivation and etching to achieve a targeted etch depth of the metal layer. In some implementations, operations 230, 240, and 250 can be repeatedly performed or cycled in a cycle of modification followed by etching of the metal layer to achieve a targeted etch depth of the metal-containing layer 310. In one example, at least one of operations 220, 230, and 240 are repeated until a top surface 370 of substrate 300 is exposed as shown in FIG. 3G.

Figure 4:
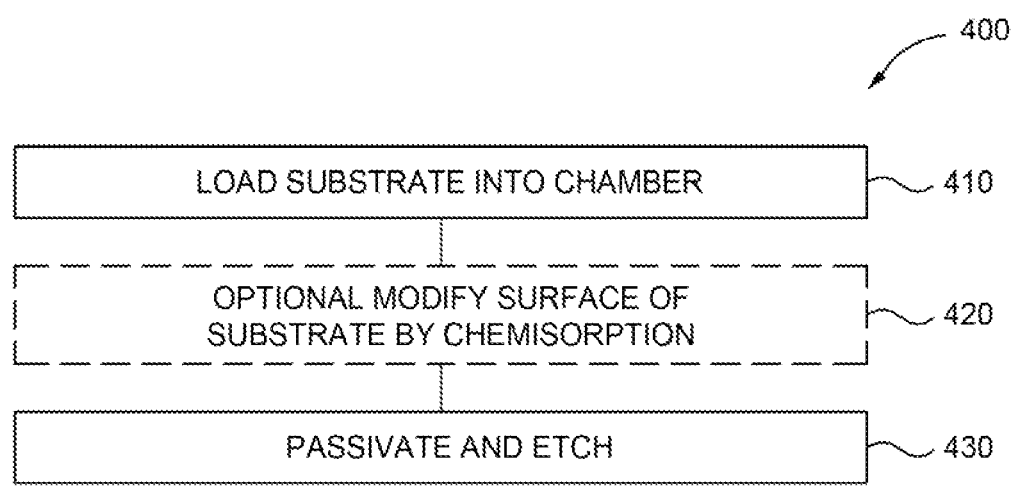
FIG. 4 illustrates a flowchart of another method of etching a feature in a substrate according to aspects disclosed herein.
Figure 5A:
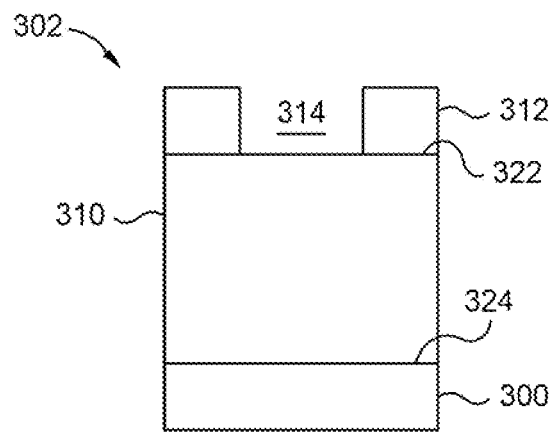
FIGS. 5A-5D illustrate various stages of an etching process according to aspects disclosed herein.
Figure 5B:
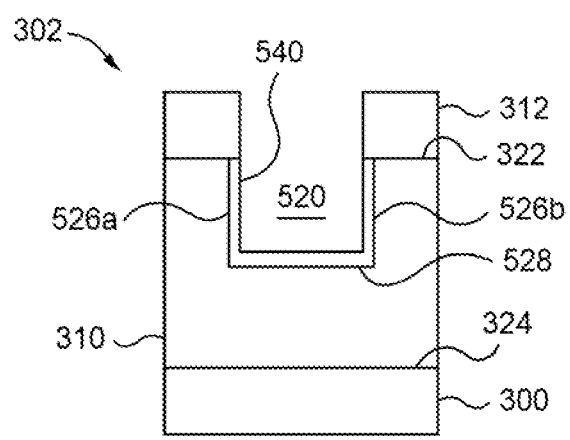
Figure 5C:
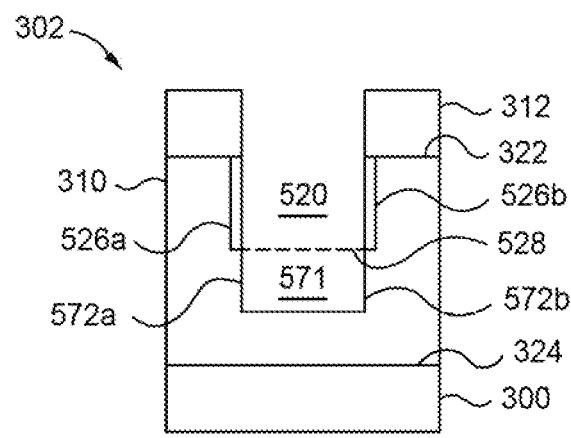

FIG. 4 illustrates a flowchart of another method 400 of etching a feature in a substrate according to aspects disclosed herein. FIGS. 5A-5C illustrate various stages of an etching process according to aspects disclosed herein. Although method 400 and FIGS. 5A-5C are discussed in the context of etching a high aspect ratio feature in a metal-containing layer it should be understood that method 400 can be used to etch other features in other types of substrates. In general, the method 400 is applicable to HAR contact mask open processes of DRAM, flash memory and logic devices as well as HAR line/space patterns (e.g., for gate line, bit line, interconnect line etches). For example, in DRAM applications, line/space etches for forming bit lines.

The method 400 begins at operation 410 by loading a substrate into a chamber, such as the plasma processing chamber 100 depicted in FIG. 1. The substrate can be substrate 300. In one example, the substrate 300 is positioned on substrate support pedestal, such as the substrate support pedestal 135 operable to control the temperature of the substrate 300. The substrate 300 is described above.

In the implementation shown in FIG. 5A, the metal-containing layer 310 is a blanket layer and the hardmask layer 312 is a patterned hardmask having an opening or aperture 314 formed therethrough. Following deposition of the hardmask layer 312, commonly known photolithography and etch processes can be employed to pattern the hardmask layer 312 and form the aperture 314. The substrate 300 can then be provided to the processing region to proceed with method 400.

In some implementations as shown in FIG. 5B, the metal-containing layer 310 can have at least a first recess 520 formed or partially formed therein. In one implementation, the metal-containing layer 310 is exposed to a plasma etch process to form the first recess 520. The plasma etch process can be any suitable plasma etch process, such as any of the plasma etch processes described herein. The first recess 520 can extend a feature depth from a top surface 322 of the metal-containing layer 310 toward a bottom surface 324 of the metal-containing layer 310. The first recess 520 has a width defined by a first sidewall 526a and a second sidewall 526b (collectively 526) aligned with the patterned hardmask layer 312. The first recess 520 can extend a feature depth from the top surface 322 of the metal-containing layer 310 to a bottom surface 528 of the first recess 520.

Optionally, the method 400 continues at operation 420 where the substrate 300 is exposed to a modification process to modify a surface of the substrate by adsorption and/or chemisorption. Operation 420 can be performed similarly to operation 230 described herein. The modification can include contacting the metal-containing layer 310 with effluents of a halide and oxygen-containing plasma. An oxygen-containing gas, a halogen-containing gas, or a mixture thereof can be flowed into the processing region to form an in-situ plasma or into a remote plasma region to produce plasma effluents. The plasma effluents can be flowed into the processing region to interact with exposed surfaces of the first recess 520 of the substrate 300. For example, as shown in FIG. 5B, the plasma effluents form a thin reactive surface layer 540 on sidewalls 526a, 526b and the bottom surface 528.

In some implementations, a purge can be performed after the modification process of operation 420. In a purge operation, non-surface bound oxygen and chlorine species are removed from the process chamber. This can be done by purging and/or evacuating the process chamber to remove non-adsorbed modification chemistry, without removing the chemisorbed layer. The species generated in a chlorine and oxygen-based plasma can be removed by stopping the plasma and allowing the remaining species to decay, optionally combined with purging and/or evacuation of the chamber. Purging can be done using any inert gas such as $N_2$, Ar, Ne, He, or a combination thereof.

The method continues at operation 430. At operation 430, a passivation and etch process is performed where the substrate 300 is exposed to an etchant gas mixture including a passivation gas and an etchant gas to selectively passivate and etch additional metal from the metal-containing layer 310 to deepen the first recess 520. Operation 430 can be performed similarly to operation 250 described herein. Operation 430 is conducted such that the sidewalls 526a, 526b are passivated while additional metal from the bottom surface 528 is removed to form a second feature 571 having sidewalls 572a, 572b while maintaining a smooth sidewall etch profile. As shown in FIG. 5C, the sidewalls 572a, 572b of the second feature are substantially aligned with the sidewalls 326a, 326b of the first feature 320.

In some implementations, a purge can be performed after the etch of operation 430. In a purge operation, plasma species are removed from the process chamber. This can be done by purging and/or evacuating the process chamber to remove remaining plasma species and etch byproducts. The plasma species generated can be removed by stopping the plasma and allowing the remaining species to decay, optionally combined with purging and/or evacuation of the chamber. Purging can be done using any inert gas such as $N_2$, Ar, Ne, He, or a combination thereof.

Figure 5D:
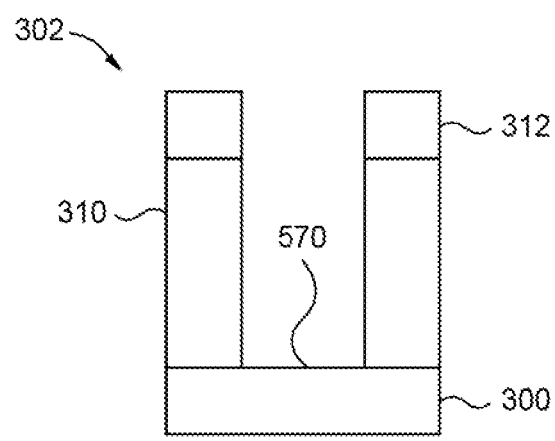

In some implementations, operations 420 and 430 can be repeatedly performed or cycled in a cycle of modification followed by passivation and etching to achieve a targeted etch depth of the metal-containing layer. In one example, at least one of operations 420 and 430 are repeated until a top surface 570 of substrate 300 is exposed as shown in FIG. 5D.

Figure 6:
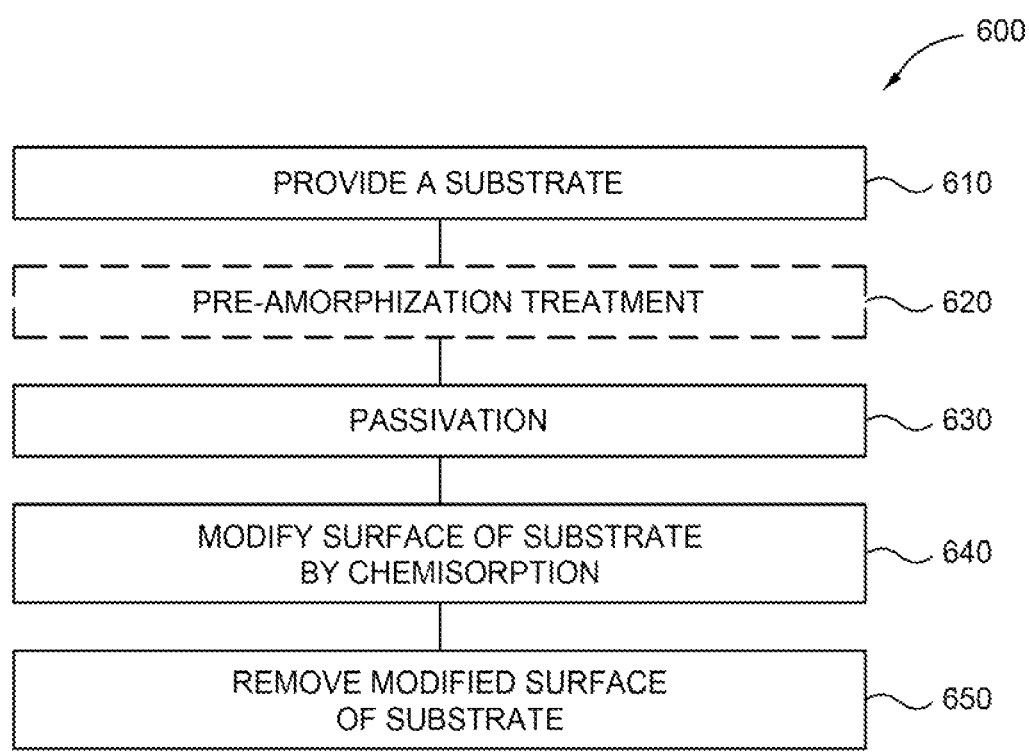
FIG. 6 illustrates a flowchart of another method of etching a feature in a substrate according to aspects disclosed herein.

FIG. 6 illustrates a flowchart of another method 600 of etching a feature in a substrate according to aspects disclosed herein. FIGS. 7A-7E illustrate various stages of an etching process according to aspects disclosed herein. Although method 600 and FIGS. 7A-7E are discussed in the context of etching a high aspect ratio feature in a metal-containing layer it should be understood that method 600 can be used to etch other features in other types of substrates. In general, the method 600 is applicable to HAR contact mask open processes of DRAM, flash memory and logic devices as well as HAR line/space patterns (e.g., for gate line, bit line, interconnect line etches). For example, in DRAM applications, line/space etches for forming bit lines.

Figure 7A:
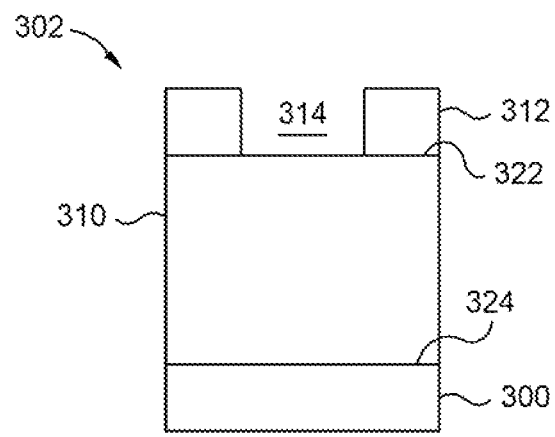
FIGS. 7A-7E illustrate various stages of an etching process according to aspects disclosed herein.
Figure 7B:
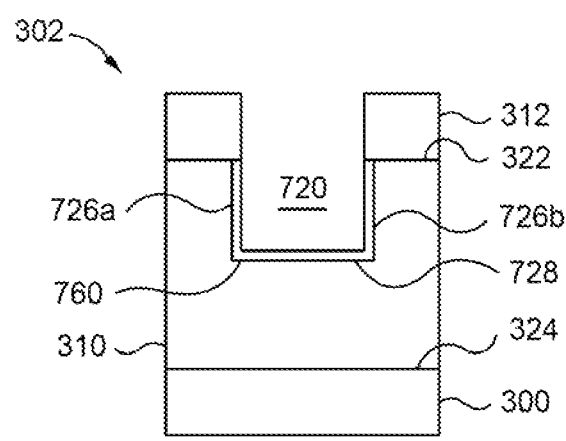

The method 600 begins at operation 610 by providing a substrate as described above. The substrate can be substrate 300 as described above. In the implementation shown in FIG. 7A, the metal-containing layer 310 is a blanket layer and the hardmask layer 312 is a patterned hardmask having an opening or aperture 314 formed therethrough. In some implementations, as shown in FIG. 7B, the metal-containing layer 310 can have at least a first recess 720 formed or partially formed therein.

At operation 620, an optional pre-amorphization treatment process is performed to modify exposed surfaces of the metal-containing layer 310. The pre-amorphization treatment can be performed similarly to operation 220.

In implementations where the pre-amorphization treatment process of operation 620 is not performed, the passivation process at operation 630, which will be described in greater detail below, can be performed directly on the metal-containing layer 310 without the pre-amorphization treatment.

At operation 630, a passivation process is performed where the substrate 300 is exposed to a passivation gas to passivate exposed surfaces of the metal-containing layer 310. Operation 630 is conducted such that the sidewalls 726a, 726b are passivated with a passivation layer 760. The passivation gas is selected from nitrogen ($N_2$), sulfur dioxide ($SO_2$), or a combination thereof. In one example, the passivation gas mixture comprises, consists essentially of, or consists of 5-100 sccm of $N_2$. As used herein, the term "consists essentially of" means that the listed components of the passivation gas mixture are greater than or equal to about 95%, 98%, or 99% of the total passivation gas mixture. In another implementation, the passivation gas mixture includes $SO_2$. In one example, the passivation gas mixture comprises, consists essentially of, or consists of 10-30 sccm of $SO_2$.

A plasma is formed from the passivation gas mixture. In one example, the passivation gas plasma is generated in-situ by forming a plasma in the processing region containing the substrate 300. In another example, the passivation gas plasma is generated remotely and can be supplied into the processing region containing the substrate 300. In some implementations, the plasma can be an inductively coupled plasma, a capacitively coupled plasma, or a microwave plasma.

Figure 7C:
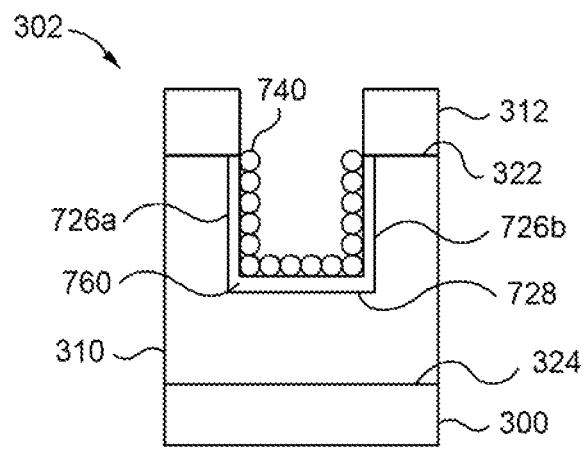

Plasma effluents of the passivation gas convert exposed surfaces of the first sidewall 726a and the second sidewall 726b into the passivation layer 760. Formation of the passivation layer 760 enables etching of the substrate without detriment of the sidewall profiles of the first sidewall 726a and the second sidewall 726b. The passivation layer 760 is distinguished from a deposited material in that passivation layer 760 is the result of a conversion of a portion of the metal-containing layer 310. Therefore, the passivation layer 760 is not merely deposited on the sidewalls 726a, 726b of the metal-containing layer 310, but rather a surface layer of the sidewalls 726a, 726b is consumed in a reaction to form the passivation layer 760. Because the passivation layer 760 is converted from a layer of the metal-containing layer 310, in an implementation, the operation 630 converts the portion of the metal-containing layer 310, along the sidewalls 726a, 726b of the first recess 720. Therefore, only a thin surface layer of the metal-containing layer 310 is to be converted into the passivation layer 760, limiting the thickness of the passivation layer and thereby avoiding formation of a step between the sidewalls 726a, 726b of the first recess 720 and sidewalls 772a, 772b (collectively 772) of the subsequently formed second recess 771 when the second recess 771 is subsequently etched as shown in FIG. 7E. As shown in FIG. 7E, the sidewalls 772a, 772b of the second feature are substantially aligned with the sidewalls 726a, 726b (collectively 726) of the first recess 720. In one example, from about 3 Å to about 15 Å of the surface layer of the metal-containing layer 310 on the first sidewall 726a and the second sidewall 726b is converted into the passivation layer 760. In another example, the passivation layer 760 is less than 50 Å. In yet another example, the passivation layer 760 has a thickness no greater than the thickness of a native oxide of the substrate. In yet another example, where the metal-containing layer 310 is ruthenium, the passivation layer 760 has a thickness from about 10 Å to about 20 Å.

The passivation layer 760 can be an oxide or nitride of the metal-containing layer 310. In one implementation, a passivating oxide can be formed by isotropically oxidizing the first recess 720 with an oxidizing plasma. A weakly oxidizing plasma forms a passivation layer that is the proper thickness. In one implementation, the weakly oxidizing plasma can include a low partial pressure of sulfur dioxide ($SO_2$) gas or a low partial pressure of oxygen ($O_2$) gas. In one example, the oxidizing plasma contains less than 100 sccm of $O_2$ or $SO_2$, for example, from about 10 sccm to about 30 sccm of $O_2$. In another implementation, a nitrogen source, such as nitrogen ($N_2$), is provided to the processing region to convert the surface of the metal-containing layer 310 of the substrate 300 on the first sidewall 326a and the second sidewall 326b into a nitride of the metal-containing layer 310. In one example, the nitriding plasma contains less than 100 sccm of $N_2$, for example, from about 10 sccm to about 30 sccm of $N_2$.

In some implementations, the process pressure during operation 630 is low to reduce undercut and bowing of the metal-containing layer 310. In some implementations, the process pressure is at or below 50 mTorr (e.g., from about 10 mTorr to about 50 mTorr). In some implementations, the process pressure is at or below 40 mTorr (e.g., from about 10 mTorr to about 40 mTorr). In some implementations, the process pressure is at or below 30 mTorr (e.g., from about 10 mTorr to about 30 mTorr). In some implementations, the process pressure is at or below 20 mTorr (e.g., from about 10 mTorr to about 20 mTorr). In one example, a plasma of a passivation gas including 50-200 sccm of $N_2$ is maintained at a pressure at or below 10 mTorr. In another such example, a plasma of a passivation gas mixture including 10-100 sccm of $SO_2$ is maintained at a pressure at or below 10 mTorr.

In further implementations, the substrate is maintained at a temperature of from about 5 degrees Celsius to about 80 degrees Celsius, and more particularly from about 20 degrees Celsius to about 50 degrees Celsius during operation 630. These low process temperatures have been found to significantly improve the etch profile (e.g., reducing bowing) in the metal-containing layer 310. In some implementations, the substrate is maintained at a temperature from about 30 degrees Celsius and 40 degrees Celsius. In some implementations, the substrate is maintained at a temperature from about 40 degrees Celsius and 50 degrees Celsius. In one example, a plasma of a passivation gas mixture including 10-100 sccm of $N_2$ is maintained at a pressure at or below 10 mTorr while the substrate is from about 30 degrees Celsius to about 40 degrees Celsius during operation 630. In another example, a plasma of an passivation gas mixture including 10-100 sccm of $N_2$ is maintained at a pressure at or below 10 mTorr while the substrate is from about 30 degrees Celsius to about 40 degrees Celsius during operation 630.

In some implementations, at least one RF generator operating at 2 MHZ, 60 MHz, or 162 MHz energizes the passivation gas mixture into a plasma during passivation of the metal-containing layer 310 during operation 630. The RF energy may be CW (continuous wave) or pulsed at 10-100 KHz pulse frequency. For implementations employing two or more RF energy sources (generators), one RF generator may be pulsed (single) or more of the RF generators may be pulsed (synchronized). In one implementation including a 2 MHz generator may be operated to output 0-1,000 Watts (e.g., 150 Watts) in CW, single pulse mode, or synchronized pulse mode.

In some implementations, a purge can be performed after the passivation process of operation 630. In a purge operation, plasma species are removed from the process chamber. This can be done by purging and/or evacuating the process chamber to remove remaining plasma species. The plasma species generated can be removed by stopping the plasma and continuing the flow of nitrogen gas.

The method 600 continues at operation 640 where the substrate 300 is exposed to a modification process to modify a surface of the substrate by adsorption and/or chemisorption. The modification process can include contacting the metal-containing layer 310 with a halide and oxygen-containing chemistry. The halide and oxygen-containing chemistry can be in the form of a gas, a plasma, or a reactive species. The modification process can include contacting the metal-containing layer 310 with halide and oxygen-containing gases or gas mixtures, which adhere to a surface of the metal-containing layer by adsorption or chemisorption onto the metal-containing layer. The modification process can include contacting the metal-containing layer 310 with effluents of a halide and oxygen-containing plasma. An oxygen-containing gas, a halogen-containing gas, or a mixture thereof can be flowed into the processing region to form an in-situ plasma or into a remote plasma region to produce plasma effluents. The plasma effluents can be flowed into the processing region to interact with exposed surfaces of the first recess 720 of the substrate 300. For example, as shown in FIG. 7C, the plasma effluents form a thin reactive surface layer 740 on sidewalls 726a, 726b and the bottom surface 728. The modification process of operation 640 can be performed similarly to the modification process of operation 230.

In some implementations, a purge can be performed after the modification process of operation 640. In a purge operation, non-surface bound oxygen and chlorine species are removed from the process chamber. This can be done by purging and/or evacuating the process chamber to remove non-adsorbed modification chemistry, without removing the chemisorbed layer. The species generated in a chlorine and oxygen-based plasma can be removed by stopping the plasma and allowing the remaining species to decay, optionally combined with purging and/or evacuation of the chamber. Purging can be done using any inert gas such as $N_2$, Ar, Ne, He, or a combination thereof.

Figure 7D:
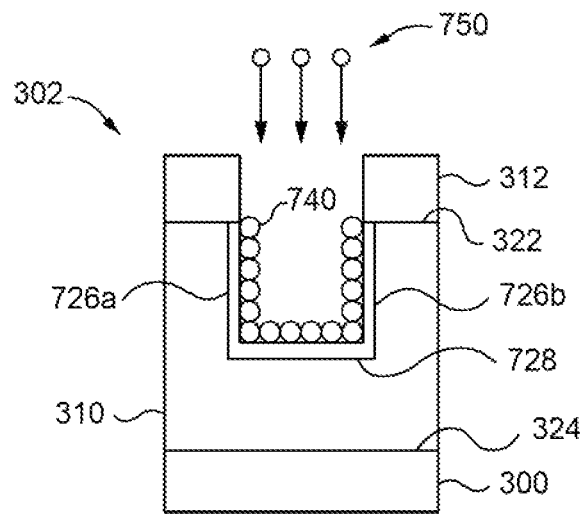
Figure 7E:
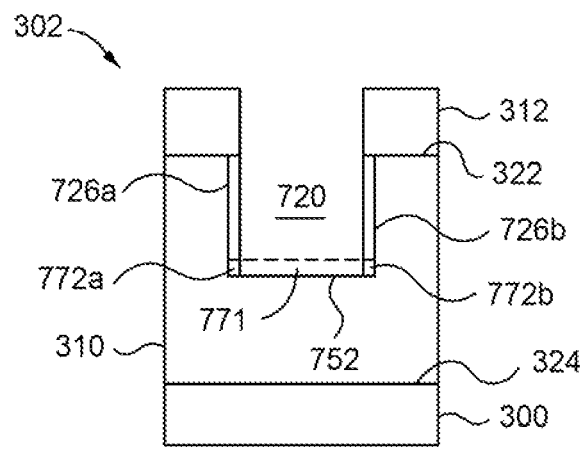

The method 600 continues at operation 650 where the substrate 300 is exposed to a removal gas such as a plasma or an ion bombardment gas to selectively etch or remove the modified portions of the surface of the substrate 300 as shown in FIG. 7D. The removal gas or ion bombardment gas can be an inert gas plasma. The inert gas is selected from argon, neon, krypton, helium, or a combination of. In one example, the inert gas is argon. In one example, the inert gas plasma is generated in-situ by forming a plasma in the processing region containing the substrate 300. In another example, the inert gas plasma is generated remotely and can be supplied into the process chamber housing the substrate. In some implementations, the plasma can be an inductively coupled plasma or a capacitively coupled plasma or a microwave plasma.

Operation 650 is conducted such that removal of modified portions from horizontal surfaces, such as the bottom surface 728 of the first recess 720 is favored over removal of modified portions from vertical surfaces such as the sidewalls 726a, 726b of the first recess 720. In some implementations during operation 650, the substrate 300 is bombarded with an ion flux 750 to etch the substrate 300. The ion flux 750 provides directional energy transfer to facilitate removal of the modified portions of the metal-containing layer 310. In one example, the ion flux 750 is anisotropic such that exposure of the passivated sidewalls 726a, 726b of the first recess 720 is reduced. The ion flux 750 bombards the horizontal surfaces such as the bottom surface 728 of the first recess 720 as shown in FIG. 7D to selectively remove modified portions from the bottom surface 728 of the first recess 720 relative to the sidewalls 726a, 726b extending the first recess 720 downward to a second bottom surface 752 as shown in FIG. 7E. The second bottom surface 752 along with sidewalls 772a, 772b define the second recess 771.

In some implementations, operations 630 to 650 can be repeatedly performed or cycled in a cycle of passivation followed by modification and then etching of the metal layer to achieve a targeted etch depth of the metal layer. In one example, operations 630, 640, and 650 are repeated until a top surface of substrate 300 is exposed. In one example, operations 630, 640, and 650 are repeated 20 to 30 times.

Implementations can include one or more of the following potential advantages. One or more implementations of the disclosure advantageously address the issue of resistivity reduction in spite of the need for shrinking nodes. In some implementations, the resistivity of a formed bit line is reduced by reducing the surface roughness of the bit line metal. Some implementations of the disclosure advantageously provide one or more of improved roughness, controlled anisotropic etch, improved selectivity to hardmask materials, and improved wafer-to-wafer and within wafer uniformity. Additionally, since surface roughness is reduced, the choice of bit line metal materials is not limited by the grain growth characteristics of the metal.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there can be additional elements other than the listed elements.

While the foregoing is directed to embodiments of the present disclosure, other and further embodiments of the disclosure can be devised without departing from the basic scope thereof, and the scope thereof is determined by the claims that follow.

The invention claimed is:

1. A method of patterning a substrate, comprising:
exposing an initial surface of a metal-containing layer to an ion doping implantation by a plasma doping (PLAD) technique to produce a surface of the metal-containing layer during a pre-amorphization treatment process; then
modifying the surface of the metal-containing layer formed over a substrate positioned in a processing region of a processing chamber by exposing the surface of the metal-containing layer to a chlorine-containing gas precursor and an oxygen-containing gas precursor to form a modified surface of the metal-containing layer;
directing plasma effluents of an inert gas precursor towards the modified surface of the metal-containing layer, wherein the plasma effluents of the inert gas precursor are directed by applying a bias voltage to a substrate support holding the substrate;
anisotropically etching the modified surface of the metal-containing layer with the plasma effluents of the inert gas precursor to form a first recess having a first sidewall in the metal-containing layer, wherein the plasma effluents of the inert gas precursor selectively etch the modified surface of the metal-containing layer relative to unmodified portions; and
exposing the first recess to an etchant gas mixture including a passivation gas and an etchant gas to remove additional metal from the metal-containing layer.

2. The method of claim 1, wherein the inert gas precursor is argon.

3. The method of claim 1, wherein the metal-containing layer comprises ruthenium.

4. The method of claim 1, wherein anisotropically etching the modified surface of the metal-containing layer forms a feature comprising a bit-line metal-containing layer.

5. The method of claim 1, wherein the chlorine-containing gas precursor flows into the processing region at a flow rate of from about 10 sccm to about 50 sccm and the oxygen-containing gas precursor flows into the processing region at a flow rate from about 100 sccm to about 150 sccm.

6. The method of claim 1, wherein a pressure within the processing region while modifying the surface of the metal-containing layer and anisotropically etching the modified surface of the metal-containing layer is maintained at about 20 mTorr or less.

7. The method of claim 1, wherein the bias voltage directing the plasma effluents of the inert gas precursor towards the modified surface of the metal-containing layer is at about 150 watts or less.

8. The method of claim 1, further comprising repeating the method in at least one additional cycle.

9. The method of claim 1, wherein a temperature of the processing chamber is maintained at about 50 degrees Celsius or less.

10. The method of claim 1, wherein modifying the surface of the metal-containing layer is performed without etching the surface of the metal-containing layer.

11. The method of claim 1, further comprising:
forming a plasma of the etchant gas mixture;
passivating, with plasma effluents of the passivation gas, the first sidewall of the first recess; and
anisotropically etching the first recess with plasma effluents of the etchant gas to deepen the first recess with a second sidewall in the metal-containing layer aligned with the first sidewall.

12. The method of claim 11, wherein the passivation gas is selected from nitrogen ($N_2$), sulfur dioxide ($SO_2$), or a combination thereof.

13. The method of claim 12, wherein the etchant gas comprises oxygen ($O_2$) and chlorine ($Cl_2$).

14. A method of patterning a substrate, comprising:
exposing an initial surface of a ruthenium-containing layer to an ion doping implantation by a plasma doping (PLAD) technique to produce a surface of the ruthenium-containing layer during a pre-amorphization treatment process; then
exposing the surface of the ruthenium-containing layer formed over a substrate positioned in a processing region of a processing chamber to an etchant gas mixture including a passivation gas selected from $N_2$ and $SO_2$ and an etchant gas comprising $O_2$ and $Cl_2$; and
anisotropically etching the ruthenium-containing layer with a plasma of the etchant gas mixture.

15. The method of claim 14, further comprising:
modifying a surface of the ruthenium-containing layer by exposing the surface of the ruthenium-containing layer to plasma effluents of a chlorine-containing gas precursor and an oxygen-containing gas precursor to form a modified surface of the ruthenium-containing layer prior to exposing the surface of the ruthenium-containing layer to the etchant gas mixture.

16. The method of claim 15, wherein anisotropically etching the ruthenium-containing layer with a plasma of the etchant gas mixture removes the modified surface of the ruthenium-containing layer.

17. A method of patterning a substrate, comprising:
exposing an initial surface of a ruthenium-containing layer to an ion doping implantation by a plasma doping (PLAD) technique to produce a surface of the ruthenium-containing layer during a pre-amorphization treatment process; then
exposing the surface of the ruthenium-containing layer formed over a substrate positioned in a processing region of a processing chamber to an etchant gas mixture, comprising:
$O_2$ having a flow rate from about 50 sccm to about 200 sccm;
$Cl_2$ having a flow rate from about 10 sccm to about 100 sccm;
argon having a flow rate from about 100 sccm to about 300 sccm; and
$N_2$ having a flow rate from about 5 sccm to about 100 sccm or $SO_2$ having a flow rate from about 10 sccm to about 30 sccm;
anisotropically etching the ruthenium-containing layer with a plasma of the etchant gas mixture to form a recess having a first sidewall in the ruthenium-containing layer, comprising:
maintaining the substrate at a temperature from about 20 degrees Celsius to about 40 degrees Celsius; and
maintaining the plasma of the etchant gas mixture at a pressure from about 10 mTorr to about 20 MTorr; and
exposing the recess to an etchant gas mixture including a passivation gas and an etchant gas to remove additional metal from the ruthenium-containing layer.

18. The method of claim 17, wherein anisotropically etching the ruthenium-containing layer forms a feature comprising a bit-line ruthenium-containing layer.

19. The method of claim 17, further comprising:
forming a plasma of the etchant gas mixture;
passivating, with plasma effluents of the passivation gas the first sidewall of the first recess; and
anisotropically etching the recess with plasma effluents of the etchant gas to deepen the recess with a second sidewall in the metal-containing layer aligned with the first sidewall.

20. The method of claim 17, wherein the passivation gas is selected from nitrogen ($N_2$), sulfur dioxide ($SO_2$), or a combination thereof, and wherein the etchant gas comprises oxygen ($O_2$) and chlorine ($Cl_2$).

* * * * *